United States Patent
Molla et al.

(10) Patent No.: US 6,927,072 B2
(45) Date of Patent: Aug. 9, 2005

(54) METHOD OF APPLYING CLADDING MATERIAL ON CONDUCTIVE LINES OF MRAM DEVICES

(75) Inventors: Jaynal A. Molla, Gilbert, AZ (US); John D'Urso, Chandler, AZ (US); Kelly Kyler, Mesa, AZ (US); Bradley N. Engel, Chandler, AZ (US); Gregory W. Grynkewich, Gilbert, AZ (US); Nicholas D. Rizzo, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 448 days.

(21) Appl. No.: 10/093,909

(22) Filed: Mar. 8, 2002

(65) Prior Publication Data

US 2003/0170976 A1 Sep. 11, 2003

(51) Int. Cl.[7] .............................................. H01L 21/00
(52) U.S. Cl. ........................ 438/3; 438/612; 438/613; 438/614; 257/295; 365/158; 365/171; 365/172; 365/173
(58) Field of Search ...................... 438/3, 612–614; 257/295, 421–425; 365/158, 171–173

(56) References Cited

U.S. PATENT DOCUMENTS

| | | | |
|---|---|---|---|
| 3,622,469 A | * 11/1971 | Alberts et al. | ............. 205/104 |
| 6,211,090 B1 | 4/2001 | Durlam et al. | |
| 6,501,144 B1 | 12/2002 | Rizzo | |
| 6,812,040 B2 | * 11/2004 | Kyler et al. | ................... 438/3 |
| 2001/0050859 A1 | 12/2001 | Schwarzl | |
| 2003/0089933 A1 | 5/2003 | Janesky et al. | |

FOREIGN PATENT DOCUMENTS

| | | |
|---|---|---|
| EP | 1052646 | 3/1965 |
| WO | WO 02/41367 A2 | 5/2002 |

* cited by examiner

*Primary Examiner*—Dung A. Le
(74) *Attorney, Agent, or Firm*—Ingrassia, Fisher & Lorenz, P.C.

(57) ABSTRACT

A method of fabricating a cladding region for use in MRAM devices includes the formation of a conductive bit line proximate to a magnetoresistive memory device. The conductive bit line is immersed in a first bath containing dissolved ions of a first conductive material for a time sufficient to displacement plate a first barrier layer on the conductive line. The first barrier layer is then immersed in an electroless plating bath to form a flux concentrating layer on the first barrier layer. The flux concentrating layer is immersed in a second bath containing dissolved ions of a second conductive material for a time sufficient to displacement plate a second barrier layer on the flux concentrating layer.

17 Claims, 2 Drawing Sheets

METHOD OF APPLYING CLADDING MATERIAL ON CONDUCTIVE LINES OF MRAM DEVICES

FIELD OF THE INVENTION

This invention relates to semiconductor memory devices. More particularly, the present invention relates to improved methods of fabricating semiconductor random access memory devices that utilize a magnetic field.

BACKGROUND OF THE INVENTION

A magnetic memory device has a structure which includes ferromagnetic layers separated by a non-magnetic layer. Information is stored as directions of magnetization vectors in magnetic layers. Magnetic vectors in one magnetic layer, for instance, are magnetically fixed or pinned, while the magnetization direction of the other magnetic layer is free to switch between the same and opposite directions which are called "Parallel" and "Anti-parallel" states, respectively. In response to parallel and anti-parallel states, the magnetic memory device represents two different resistances. The resistance indicates minimum and maximum values when the magnetization vectors of two magnetic layers point in substantially the same and opposite directions, respectively. Accordingly, a detection of changes in resistance allows a magnetic memory device to provide stored information.

In magnetoresistive random access memory (hereinafter referred to as "MRAM") devices, the memory cells are programmed by magnetic fields induced by a current carrying conductor such as a copper interconnect. Typically, two interconnects are employed, with one positioned above (generally referred to as the bit line) the MRAM device and the second positioned below (generally referred to as the digit line) the MRAM device. Because the name and position of the lines may be altered in various applications, the term "conductive line or lines" will be used to generally identify either or both lines hereinafter. The purpose of the electrically conductive lines is to provide magnetic fields for programming the MRAM device.

A problem with prior semiconductor processing of conductive lines for MRAM devices is that it involves using a number of expensive and complicated vacuum deposition tools and complex processing steps which increase the cycle time and cost. For example, the preferred method of forming the conductive lines is to form copper interconnects by a damascene or inlaid process wherein the conductive line is typically covered with a flux concentrating layer. The flux concentrating layer functions to focus the magnetic field around the conductive line toward the MRAM cell or bit, and, consequently, reduces the required programming current by a factor of approximately two. However, the steps involved in forming the flux concentrating material require the use of several vacuum deposition and etching tools, as well as photolayers. For example, reactive ion etching (hereinafter referred to as "RIE") is typically used to remove the evaporated layers from unwanted areas. Unfortunately, RIE can over-etch the layers, which can cause shorting. Also, photolayers are an expensive step in device fabrication, so the cost can be reduced by utilizing alternative techniques.

It would be highly advantageous, therefore, to remedy the foregoing and other deficiencies inherent in the prior art.

SUMMARY OF THE INVENTION

To achieve the objects and advantages specified above and others, an improved method of fabricating a flux concentrating region for use in a MRAM device is disclosed. The method involves forming a flux concentrating region positioned on a conductive line by using electrochemical deposition. In the preferred embodiment, the conductive line includes conductive material, such as copper, aluminum, or similar metals. The novel method of fabricating the flux concentrating layer involves immersing the conductive line in a bath containing dissolved metal ions of a metal more noble than the metal that constitutes the conductive line. For example, if copper is the conductive line, the bath may comprise palladium, platinum, ruthenium, or rhodium. Because the dissolved metal ions are more noble than the conductive line, a process known as displacement plating occurs only on the conductive line and nowhere else. The process forms a barrier layer on the conductive line. The barrier layer is then immersed in an electrolessly plating bath to form a flux concentrating layer positioned on the barrier layer. In a preferred embodiment, the flux concentrating layer includes NiFe, but other electrolessly plating magnetic materials could be used as well.

In an additional and optional processing step, the flux concentrating layer is immersed in a second displacement plating bath containing dissolved metal ions. The dissolved metal ions in the second bath form a second barrier layer on the flux concentrating layer through displacement plating. The first barrier layer, flux concentrating layer, and second barrier layer cooperate to form a cladding or flux concentrating region that increases the magnetic field proximate to the conductive bit or digit line. Also, the thickness of the first outside layer, flux concentrating layer, and second barrier layer can be controlled by the immersion time in the various baths.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF A PREFERRED EMBODIMENT

Several embodiments of cladded conductive lines in magnetic proximity to MRAM devices are discussed in conjunction with the drawings in order to illustrate the preferred method of forming cladding material on MRAM device conductive lines. Turning now to FIGS. 1 through 5, several sequential steps are illustrated in the fabrication of a MRAM device 10 with a cladded conductive line, in accordance with the present invention. In the preferred embodiment, the conductive line includes copper. However, it will be understood that the conductive line can include other conductive materials, such as aluminum, tungsten, titanium, and stacks thereof where, in general, the fabrication steps or materials might vary slightly.

Figure 1:
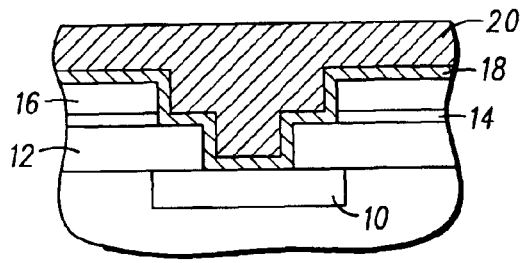
FIGS. 1 through 5 are simplified sectional views illustrating several steps in a method of fabricating a magnetoresistive random access memory device with a damascene conductive bit line in accordance with the present invention.

Referring specifically to FIG. 1, a first step in the fabrication of a conductive line for MRAM device 10 is illustrated. It will be understood that this is a simplified view, generally showing the areas of interest, and in particular a conductive line region. Also, for ease of discussion, the fabrication of the conductive line in electrical contact with MRAM device 10 is discussed in reference to FIGS. 1 through 5. However, it should be understood that it is also anticipated by this disclosure to form a conductive bit line that is adjacent to and not in electrical contact with MRAM device 10.

Further, in this specific embodiment, MRAM device 10 is a standard MRAM bit or cell formed according to well-known practices in the art. While a standard MRAM bit is illustrated herein for convenience, it will be understood by those skilled in the art that many other types of memory devices could be provided. Also, while a single MRAM bit is illustrated for convenience, it should be understood that a complete array of devices or control/driver circuits around the periphery of an array of magnetic memory bits may be formed.

Figure 2:
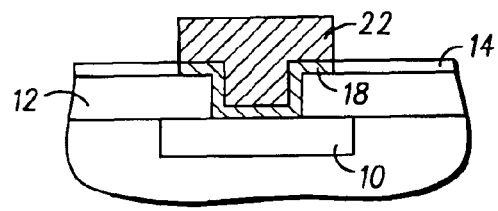

A typical damascene conductive line is formed in proximity to MRAM device 10 generally incorporating the following steps. A dielectric layer 12 is formed on a surface of MRAM device 10 and any surrounding material. In some specific embodiments layer 12 may be formed around MRAM device 10 during the fabrication of MRAM device 10. A nitride (any nitride, such as a metal nitride) layer 14 is positioned on layer 12 and generally operates as an etch stop layer. A second oxide layer 16 is formed on nitride layer 14. A trench is then formed through layers 12, 14, and 16 in alignment with MRAM device 10 in any well known process. A thin barrier layer 18, of tantalum, tantalum nitride, or the like, is deposited on the surface of the trench and surrounding layers 12, 14, 16. A thin seed layer (not shown) of copper is deposited on barrier layer 18. For convenience, barrier layer 18 is generally referred to as a barrier/copper seed layer. A thick copper layer 20 is then electroplated onto barrier/copper seed layer 18. Copper layer 20 and barrier/copper seed layer 18, are partially removed by any well known process (e.g. chemical mechanical polishing or a similar technique) and oxide layer 16 is removed by etching (nitride layer 14 may or may not be removed during the etching process) to provide conductive line 22, as illustrated in FIG. 2.

In the preferred embodiment, conductive line 22 includes copper, but it will be understood that it could include other conductive materials, such as aluminum, tungsten, etc. However, it is well known in the art that copper is generally used in advanced semiconductor processing to form conductive interconnects. Accordingly, it is intended that the method described herein be applicable to both a copper damascene process and other metal damascene or non-damascene processes wherein the materials and fabrication steps are adjusted accordingly for the chosen metal process. More information as to cladding a MRAM device can be found in U.S. Pat. No. 6,211,090, entitled "Method of Fabricating Flux Concentrating Layer for use with Magnetoresistive Random Access Memories", issued on Apr. 3, 2001, and incorporated herein by reference.

Figure 3:
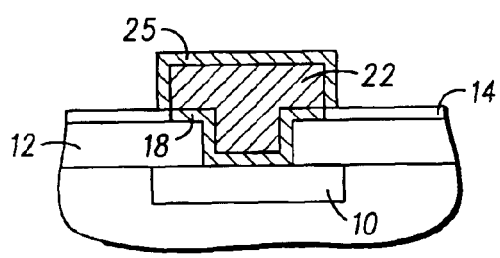

Turning now to FIG. 3, a first barrier layer 25 is formed on conductive line 22 as follows. Conductive line 22 is immersed in a bath containing dissolved ions of a selected metal to form a barrier layer 25 with a thickness sufficient to provide good barrier properties. The metal ion bath includes dissolved ions that are more noble than the metal included in conductive line 22 (e.g. copper) so that displacement plating occurs. Suitable metal ions in the first bath include platinum, palladium, ruthenium, or rhodium, but other materials may be used and will depend on the composition of conductive line 22. The thickness of barrier layer 25 can generally be controlled by changing the amount of time conductive line 22 is immersed in the metal ion bath. Barrier layer 25 acts as a diffusion barrier to fast diffusing elements, such as copper, and nickel-iron alloys.

Figure 4:
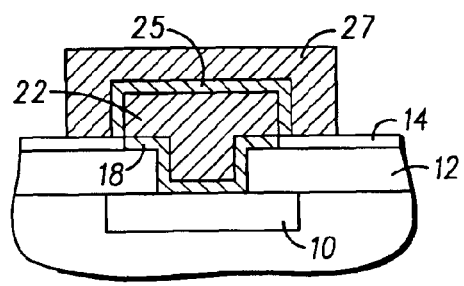

Referring additionally to FIG. 4, barrier layer 25 is immersed in an electroless plating bath to form a flux concentrating layer 27 with a thickness sufficient to provide good flux concentrating properties. Further, changing the amount of time that barrier layer 25 is immersed in the electroless plating bath generally controls the thickness of flux concentrating layer 27. Flux concentrating layer 27 is formed of a high permeability magnetic material and has the characteristic of concentrating magnetic flux produced by the current flowing in conductive line 22, therefore, reducing the amount of current required to produce the desired action. The electroless plating bath may, for example, include one or more of Ni/B, Ni/P, Co/P, Fe/Ni/P, Fe/Ni/B, Ni/Fe/B/P, or Ni/Fe/Co/P, but it will be understood that other material systems may be used in specific applications. Flux concentrating layer 27 is also an electrically conducting magnetic material, such as nickel iron, or any suitable material having sufficiently high permeability to concentrate the magnetic flux in the desired area and be metallurgically compatible with the remaining material structure.

Figure 5:
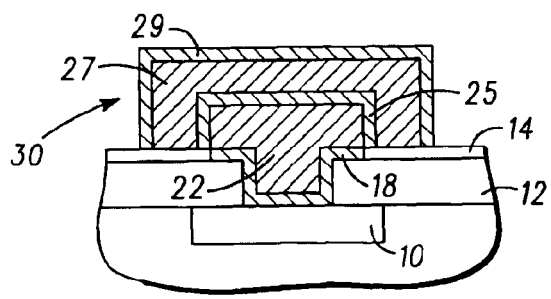

Referring additionally to FIG. 5, flux concentrating layer 27 is immersed in a second bath containing dissolved ions of a second metal to form a second barrier layer 29. Suitable metal ions for use in the second bath include platinum, palladium, ruthenium, or rhodium, but it will be understood that other materials may be used. Changing the amount of time that flux concentrating layer 27 is immersed in the second metal ion bath generally controls the thickness of barrier layer 29. It will be understood that in some embodiments, the formation of barrier layer 29 may not be desired and is included in the preferred embodiment for illustrative purposes only.

Barrier layer 25, flux concentrating layer 27, and barrier layer 29 cooperate to form a cladding region 30. The layers of cladding region 30 are deposited by using immersion or electroless plating, as described above, which eliminates the need to pattern and etch the cladding materials. Eliminating the pattern and etch steps substantially improves the process (e.g. simpler processing steps, at a reduced cost, and with a reduced cycle time) and produces a much more reliable product (e.g. not as subject to shorting and similar problems).

Figure 6:
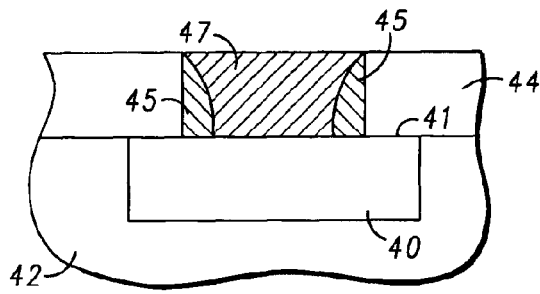
FIGS. 6 through 10 are simplified sectional views illustrating several steps in a method of fabricating a magnetoresistive random access memory device with a self aligned conductive bit line in accordance with the present invention.

Turning now to FIGS. 6 through 10, a process is illustrated for fabricating a self-aligned flux concentrating region in conjunction with a conductive line, in accordance with the present invention. Referring specifically to FIG. 6, a MRAM cell or device 40 is formed in any well known manner and at least partially encapsulated in material 42 so as to provide a smooth upper surface 41. A layer 44 of dielectric material, e.g. oxide, nitride, or the like, is deposited on surface 41 and patterned to provide a trench in alignment with MRAM device 40. Sidewall spacers 45 are formed in the trench by any of the well known methods (see for example, U.S. Pat. No. 5,940,319, included herein by reference). In this embodiment, spacers 45 are formed of cladding or flux concentrating materials, and, optionally barrier materials, that aid in concentrating or directing magnetic flux toward MRAM device 40. The trench is then filled with a conductive material, such as copper, titanium, aluminum, etc., to form a conductive line 47.

Figure 7:
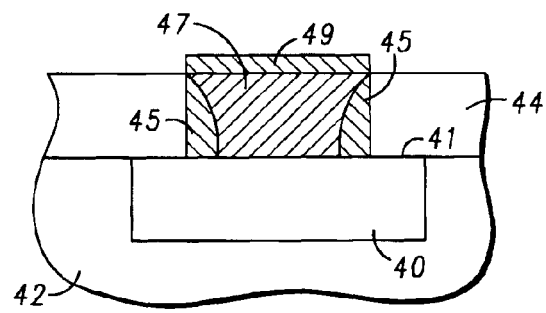

Referring additionally to FIG. 7, conductive line 47 is immersed in a bath containing dissolved ions of a selected metal to form a barrier layer 49. As explained above, the metal ion bath includes dissolved ions that are more noble than the metal included in conductive line 47 (e.g. copper) so that displacement plating occurs. Suitable metal ions in the first bath include platinum, palladium, ruthenium, or rhodium, but other materials may be used and will depend on the composition of conductive line 47. The thickness of barrier layer 49 can generally be controlled by changing the amount of time conductive line 47 is immersed in the metal ion bath. Barrier layer 49 acts as a diffusion barrier to fast diffusing elements, such as copper, and nickel-iron alloys. Here it should be noted that displacement plating occurs only in conjunction with conductive line 47 and, therefore, barrier layer 49 is self-aligned with conductive line 47.

Figure 8:
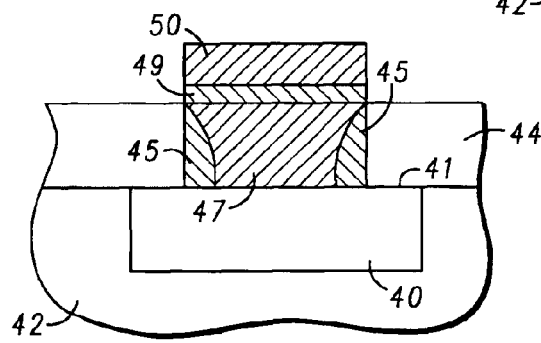

Referring additionally to FIG. 8, barrier layer 49 is immersed in an electroless plating bath to form a flux concentrating layer 50 with a thickness sufficient to provide good flux concentrating properties. Changing the amount of time that barrier layer 49 is immersed in the electroless plating bath generally controls the thickness of flux concentrating layer 50. Flux concentrating layer 50 is formed of a high permeability magnetic material and has the characteristic of concentrating magnetic flux produced by the current flowing in conductive line 47, therefore, reducing the amount of current required to produce the desired action. The electroless plating bath may, for example, include one or more of Ni/B, Ni/P, Co/P, Fe/Ni/P, Fe/Ni/B, Ni/Fe/B/P, or Ni/Fe/Co/P, but it will be understood that other material systems may be used in specific applications. Flux concentrating layer 50 is also an electrically conducting magnetic material, such as nickel iron, or any suitable material having sufficiently high permeability to concentrate the magnetic flux in the desired area and be metallurgically compatible with the remaining material structure. Again it should be noted that plating occurs only in conjunction with barrier layer 49 and, therefore, flux concentrating layer 50 is self-aligned with barrier layer 49 and conductive line 47.

Figure 9:
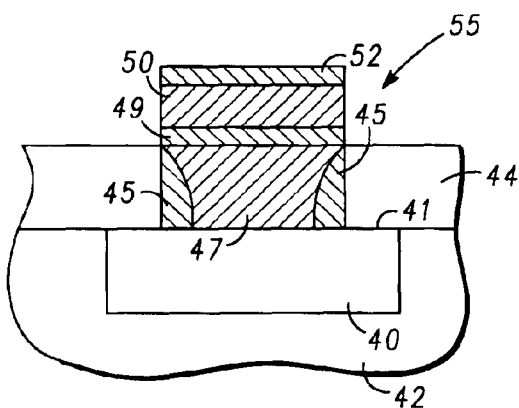

Referring additionally to FIG. 9, flux concentrating layer 50 is immersed in a second bath containing dissolved ions of a second metal to form a second barrier layer 52. Suitable metal ions for use in the second bath include platinum, palladium, ruthenium, or rhodium, but it will be understood that other materials may be used. Changing the amount of time that flux concentrating layer 50 is immersed in the second metal ion bath generally controls the thickness of barrier layer 52. It will be understood that in some embodiments, the formation of barrier layer 52 may not be desired and is included in the preferred embodiment for illustrative purposes only. Barrier layer 49, flux concentrating layer 50, and barrier layer 52 (if included) are generally referred to as cladding region 55.

Figure 10:
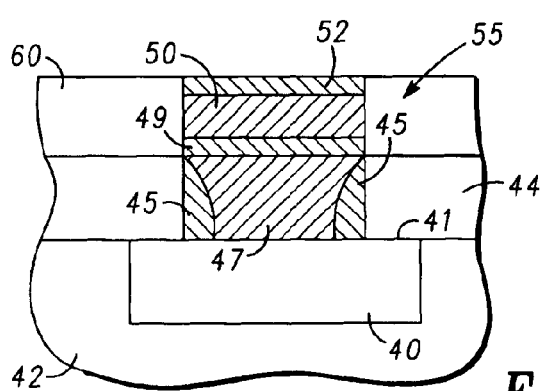

Turning now to FIG. 10, a layer 60 of dielectric material (e.g. oxides, nitrides, or the like) is deposited on layer 44 around cladding region 55. Here it should be understood that layer 60 can be deposited and patterned prior to the formation of cladding region 55 or it can be deposited subsequently, as described above, depending upon the specific application and the processes used in other areas of the structure. In some processes, for example, flux concentrating layer 50 and barrier layer 52 may extend slightly over the edges of a previously formed layer (e.g. barrier layer 49 and flux concentrating layer 50, respectively). When this additional material is undesirable, (e.g. because of adjacent components or MRAM devices) the formation can be limited through the use of layer 60.

Thus, the method of fabricating cladding region 30 in FIG. 5 and cladding region 55 in FIG. 10 involves using electrochemical deposition, such as immersion or electroless plating, to form the necessary layers. Electrochemical deposition improves the fabrication sequence because it eliminates a photolayer. Thus, the processing steps are simpler and less expensive. However, by using electrochemical deposition to form cladding regions 30 and 55, no photosteps are needed and the cycle time to fabricate MRAM devices is reduced. Also, by using electrochemical deposition, the shorting problem associated with using subtractive patterning is avoided and the number of expensive photolayers is decreased.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

What is claimed is:

1. A method of fabricating a cladding region for use in a magnetoresistive memory device comprising the steps of:
   providing a conductive line formed of conductive material and positioned proximate to a magnetoresistive memory device;
   using a first electrochemical deposition bath to form a first barrier layer on the conductive line by one of immersion, electroless plating, and displacement plating; and
   using a second electrochemical deposition bath to form a flux concentrating layer on the first barrier layer.

2. A method as claimed in claim 1 including in addition the step of using a third electrochemical deposition bath to form a second barrier layer on the flux concentrating layer.

3. A method as claimed in claim 2 wherein the step of using the third electrochemical deposition bath to form the second outside barrier layer includes using a second immersion bath wherein the second immersion bath includes one of platinum, palladium, ruthenium, rhodium, rhenium, iridium, and another suitable material more noble than the flux concentrating layer.

4. A method as claimed in claim 2 including in addition a step of controlling the second barrier layer thickness by controlling a time of immersion in the third electrochemical deposition bath.

5. A method as claimed in claim 1 wherein the step of using the second electrochemical deposition each include using one of immersion and electroless plating.

6. A method as claimed in claim 1 wherein the step of using the first electrochemical deposition bath to form the first barrier layer includes using a first immersion bath including one of platinum, palladium, ruthenium, rhodium, rhenium. iridium, and another suitable material more noble than the conductive material included in the conductive line.

7. A method as claimed in claim 1 wherein the step of using the second electrochemical deposition bath to form the flux concentrating layer includes using an electroless plating bath wherein the electroless plating bath includes one of Ni/B, Ni/P, Co/P, Fe/Ni/P, Fe/Ni/B, Ni/Fe/Co/P, Ni/Fe/B/P.

8. A method as claimed in claim 1 including in addition a step of controlling the first barrier layer thickness by controlling a time of immersion in the first electrochemical deposition bath.

9. A method as claimed in claim 1 including in addition a step of controlling the flux concentrating layer thickness by controlling a time of immersion in the second electrochemical deposition bath.

10. A method as claimed in claim 1 wherein the conductive material forming the conductive line includes one of copper and aluminum.

11. A method of fabricating a cladding region for use in a magnetoresistive memory device comprising the steps of:
providing a conductive line formed of conductive material and positioned proximate to a magnetoresistive memory device;
displacement plating a first barrier layer on the conductive line;
using en electrochemical deposition bath, forming a flux concentrating layer on the first barrier layer; and
displacement plating a second barrier layer on the flux concentrating layer.

12. A method as claimed in claim 11 wherein the step of providing the conductive line includes providing a conductive line at least partially in a trench formed of dielectric material.

13. A method as claimed in claim 11 wherein the step of displacement plating the first barrier layer includes using a first bath including one of platinum, palladium, ruthenium, rhodium, rhenium,, iridium, and another suitable material more noble than the conductive material forming the conductive line.

14. A method as claimed in claim 11 wherein the step of displacement plating the second barrier layer includes using in the bath one of platinum, palladium, ruthenium, rhodium, rhenium, and iridium, and another suitable material more noble than material forming the flux concentrating layer.

15. A method as claimed in claim 11 including in addition the step of controlling the thicknesses of the first barrier layer, the flux concentrating layer, and the second barrier layer by controlling a time of immersion.

16. A method as claimed in claim 11 wherein the material forming the conductive line includes one of copper, titanium, and aluminum.

17. A method as claimed in claim 11 wherein the electrochemical deposition bath includes one of Ni/B, Ni/P, Co/P, Fe/Ni/P, Fe/Ni/B, Ni/Fe/Co/P, and Ni/Fe/B/P.

* * * * *

UNITED STATES PATENT AND TRADEMARK OFFICE
CERTIFICATE OF CORRECTION

PATENT NO. : 6,927,072 B2 Page 1 of 1
APPLICATION NO. : 10/093909
DATED : August 9, 2005
INVENTOR(S) : Jaynal A. Molla It is certified that error appears in the above-identified patent and that said Letters Patent is hereby corrected as shown below:

In Column 7, Line 11, Claim No. 11:

Change "en" to --an--

Signed and Sealed this

Third Day of October, 2006

JON W. DUDAS
*Director of the United States Patent and Trademark Office*